(12) United States Patent
Kijima

(10) Patent No.: US 6,376,090 B1
(45) Date of Patent: Apr. 23, 2002

(54) METHOD FOR MANUFACTURING A SUBSTRATE WITH AN OXIDE FERROELECTRIC THIN FILM FORMED THEREON AND A SUBSTRATE WITH AN OXIDE FERROELECTRIC THIN FILM FORMED THEREON

(75) Inventor: Takeshi Kijima, Urawa (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/406,282

(22) Filed: Sep. 24, 1999

(30) Foreign Application Priority Data

Sep. 25, 1998 (JP) .......................................... 10-270399

(51) Int. Cl.⁷ .......................... B32B 15/04; H01L 49/02
(52) U.S. Cl. ........................ 428/469; 438/660; 438/686
(58) Field of Search .................................. 428/701, 469, 428/697, 699, 700, 702; 438/652, 660, 686; 427/379, 380, 318, 383.3, 383.5

(56) References Cited

U.S. PATENT DOCUMENTS 6,146,935 A * 11/2000 Park et al. .................. 438/238

FOREIGN PATENT DOCUMENTS

JP     8-222711     8/1996
JP     10-50960     2/1998

OTHER PUBLICATIONS

Takashi Nakamura, et al, Jpn. J. Appl. Phys., vol. 32, 1993, "Preparation of C–Axis–Oriented $Bi_4Ti_3O_{12}$ Thin Films by Metalorganic Chemical Vapor Deposition", pp. 4086–4088. (No month).

Kuniaki Yoshimura, et al., J. Ceramic Soc. Japan, 102 [5] (1994), "Preparation of $Bi_4Ti_3O_{12}$ Thin Films with c–axis Orientation by MOCVD Using Bi $(o-C_7H_7)_3$ and $Ti(i-OC_3H_7)_2$ $(DPM)_2$", pp. 512–515.

Nakamura et al. Preparation of Pb(Zr,Ti)O3 thin films on electrodes including IrO2. Appl. Phys. Lett. 65 (12). Sep. 19, 1994. pp. 1522–1524.*

* cited by examiner

Primary Examiner—John J. Zimmerman
(74) Attorney, Agent, or Firm—David G. Conlin; John B. Alexander; Edwards & Angell, LLP

(57) ABSTRACT

A method for manufacturing a substrate with an oxide ferroelectric thin film formed thereon includes the steps of forming an electrode on a substrate, prebaking the substrate with the electrode formed thereon and forming an oxide ferroelectric thin film on the resultant electrode.

17 Claims, 12 Drawing Sheets

As—Pt
CHARGE 2.1
Hysterisis   Vertual Ground Mode
Xdiv=62.500
Ydiv=14.5342     μC/cm²
Offset=9.183
R Compensated KV/cm 200℃—Pt
CHARGE 2.1
Hysterisis   Vertual Ground Mode
Xdiv=62.500
Ydiv=15.0220     μC/cm²
Offset=12.964
R Compensated KV/cm 300℃－Pt
CHARGE 2.1
Hysterisis  Vertual Ground Mode
Xdiv=62.500
Ydiv=16.3200
Offset=22.681
R Compensated 400℃－Pt
CHARGE 2.1
Hysterisis  Vertual Ground Mode
Xdiv=62.500
Ydiv=11.6633
Offset=14.983
R Compensated 500°C—Pt

CHARGE 2.1

Hysterisis  Vertual Ground Mode

Xdiv=62.500

Ydiv=10.4889    $\mu C/cm^2$

Offset=15.245

R Compensated

KV/cm

600°C—Pt

CHARGE 2.1

Hysterisis  Vertual Ground Mode

Xdiv=62.500

Ydiv=14.0773    $\mu C/cm^2$

Offset=4.262

R Compensated

KV/cm

700℃-Pt
CHARGE 2.1
Hysterisis  Vertual Ground Mode
Xdiv=62.500
Ydiv=7.2978
Offset=4.835
R Compensated

METHOD FOR MANUFACTURING A SUBSTRATE WITH AN OXIDE FERROELECTRIC THIN FILM FORMED THEREON AND A SUBSTRATE WITH AN OXIDE FERROELECTRIC THIN FILM FORMED THEREON

CROSS-REFERENCES TO RELATED APPLICATIONS

This application is related to Japanese patent application No. HEI 10(1998)-270399 filed on Sep. 25, 1998 whose priority is claimed under 35 USC §119, the disclosure of which is incorporated herein by reference in its entirety.

BACKGROUND OF THE INVENTION

1. Field of the Invention

The present invention relates to a method for manufacturing a substrate with an oxide ferroelectric thin film formed thereon and a substrate with a oxide ferroelectric thin film formed thereon. More particularly it relates to a method for manufacturing a substrate with an oxide ferroelectric thin film formed thereon and a substrate with a oxide ferroelectric thin film formed thereon that can be suitably applied to a memory element, a pyroelectric element, a piezoelectric element, an optical device and the like.

2. Description of the Related Art

Among many oxide materials, some have various properties such as a ferroelectric property, a high dielectric property, a piezoelectric property, a pyroelectric property, an electro-optical effect and the like, and are generally referred to as oxide ferroelectric materials. These oxide ferroelectric materials include, for example, $Pb(Zr_{1-x}Ti_x)O_3$ (hereafter referred to as PZT), $BaTiO_3$, $Bi_4Ti_3O_{12}$, $LiNbO_3$ and the like. Development of many devices such as a capacitor, a pressure sensor, an infrared sensor, an oscillator, a frequency filter, an optical switch and the like has been carried out by utilizing these excellent properties of the oxide ferroelectric materials.

Especially, in accordance with recent development of a thin film forming technique, scale reduction and process simplification of devices are attempted by applying a high dielectric property of the oxide ferroelectric materials to a capacitor of a semiconductor device such as a DRAM. Also, development of a device having a novel function such as a non-volatile memory (ferroelectric non-volatile memory) having a high density and operating at a high speed is carried out by applying the ferroelectric property to a memory of a semiconductor device such as a DRAM.

A ferroelectric non-volatile memory realizes a memory that eliminates the need for a backup power supply by utilizing a ferroelectric property (hysteresis effect) of a ferroelectric substance. For the development of such devices, it is necessary to use a material having a large residual polarization and a small coercive field.

At present, regarding destructive read-out type ferroelectric memories referred to as 1T1C, small-capacitance products of 256 kbit or less are becoming commercialized using a ferroelectric thin film having a residual polarization value of about 10 to 20 $\mu C/cm^2$. However, it is essential to develop a ferroelectric thin film having a residual polarization value of 20 $\mu C/cm^2$ or more in order to develop a ferroelectric memory having a capacitance of 1 Mbit or more.

Further, in order to obtain good electric properties, it is necessary to use a material having a low leakage current and a high endurance against repetition of polarization inversion. For this purpose, control of a surface morphology after forming a film is an importance problem. Further, for reduction of an operation voltage and adaptation to fine semiconductor processes, it is desired to realize the above-mentioned properties with a thin film having a thickness of less than several hundred nanometers.

Among the above-mentioned oxide ferroelectric materials, PZT is the most extensively studied material, and a thin film using PZT is fabricated by the sputtering method or the sol-gel method. PZT is a solid solution of $PbZrO_3$ and $PbTiO_3$, and has a Zr/Ti ratio of 1 to 1.5. $PbTiO_3$ is a ferroelectric substance having a perovskite structure that belongs to a tetragonal system and has a spontaneous polarization along a c-axis direction. Although $PbZrO_3$ is an anti-ferroelectric substance having a perovskite structure that belongs to an orthorhombic system, $PbZrO_3$ forms a solid solution with $PbTiO_3$ to increase a Ti content and is transformed into a ferroelectric substance.

An oxide ferroelectric substance $Bi_4Ti_3O_{12}$ is a ferroelectric substance having a perovskite structure that belongs to an orthorhombic system. The spontaneous polarization of $Bi_4Ti_3O_{12}$ has two components, one along an a-axis direction and the other along a c-axis direction. Especially, since the coercive field along the c-axis direction is small, application of $Bi_4Ti_3O_{12}$ to a ferroelectric non-volatile memory operable at a low voltage is expected.

In order to achieve practical application of the above-mentioned oxide ferroelectric material to these devices, a thin film forming technique is important and carried out by the sol-gel method, the sputtering method, the MOCVD method, the laser abrasion method or the like.

A substrate for forming the above-mentioned oxide ferroelectric material thereon by using one of these film forming methods may be a substrate having an electrode made of Pt(111), Ir(111), an oxide superconductive material or the like.

In the case of PZT, although the ferroelectric property of PZT depends largely on the composition x, the film composition is liable to change at the time of forming the film or carrying out a thermal treatment because PZT contains Pb having a high vapor pressure. Therefore, it is difficult to find a factor that determines the orientation or the crystallinity (morphology). As a result, leakage current and deterioration in endurance against polarization inversion are liable to occur in accordance with the reduction of the film thickness due to generation of pinholes, generation of a low dielectric layer caused by reaction of the underlayer electrode Pt and Pb, or the like.

On the other hand, in the case of $Bi_4Ti_3O_{12}$, it is necessary to perform a thermal treatment of 650° C. or more in order to obtain a good ferroelectric property by means of the conventional sol-gel method, so that the surface directions to be obtained are limited and it is difficult to control the orientation. In the case of forming the film by the MOCVD method, it is reported that a pyrochlore phase ($Bi_2Ti_2O_7$) is liable to be generated (See Jan. J. Appl. Phys., 32, 1993, p. 4086, and J. Ceramic Soc. Japan, 102, 1994, p. 512).

In any of the above-mentioned film-forming methods, the obtained surface morphology generally consists of gross crystal particles of 0.5 $\mu$m or more, so that the thin film cannot be applied to a highly integrated semiconductor device that requires a fine processing. Moreover, if the thin film has a thickness of several hundred nanometers or less, pinholes are generated and it is difficult to suppress leakage current. Also, it is not easy to obtain a residual polarization and a coercive field as desired by controlling the orientation direction.

Japanese Unexamined Patent Publication No. HEI 08(1996)-222711 and Japanese Unexamined Patent Publication No. HEI 10(1998)-50960 disclose that suppression of leakage current and endurance against repetition of polarization inversion are greatly improved by inserting a $TiO_x$ thin layer at an interface between a PZT thin film and a lower electrode made of Pt or Ir, and at an interface of laminated PZT thin film layers to provide nucleation for the PZT thin film in forming the PZT film by the sol-gel method. However, the obtained ferroelectric property gives a residual polarization value of 20 $\mu C/cm^2$ or less, which does not exceed a conventionally obtained range.

As described above, if an oxide ferroelectric thin film such as PZT or $Bi_4Ti_3O_{12}$ is to be formed on a metal electrode such as Pt or Ir by using a film forming technique such as the sol-gel method, the sputtering method or the MOCVD method according to the above-mentioned technique, it is difficult to control the orientation property, the orientation direction or the morphology of the oxide ferroelectric thin film because the ferroelectric thin film must be exposed to a high temperature for a long period of time at the time of forming the film or carrying out a thermal treatment. As a result, it is difficult to suppress the leakage current generated in the obtained oxide ferroelectric thin film and deterioration in the endurance against polarization inversion. Also it is not easy to obtain a residual polarization and a coercive field as desired.

SUMMARY OF THE INVENTION

The present invention provides a method for manufacturing a substrate with an oxide ferroelectric thin film formed thereon, comprising the steps of: forming an electrode on a substrate, prebaking the substrate with the electrode formed thereon and forming an oxide ferroelectric thin film on the resultant electrode.

Also, the present invention provides a substrate with an oxide ferroelectric thin film formed by the above-mentioned method.

That is, the present invention has been made in order to solve the above-mentioned problems and the purpose thereof is to provide a method for manufacturing a substrate with an oxide ferroelectric thin film formed thereon and a substrate with an oxide ferroelectric thin film formed thereon being capable of controlling the orientation property, the orientation direction or the morphology of the oxide ferroelectric thin film and having a residual polarization value and a coercive field value required in realizing a non-volatile memory having a capacity of Mbit or more together with an endurance against polarization inversion.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
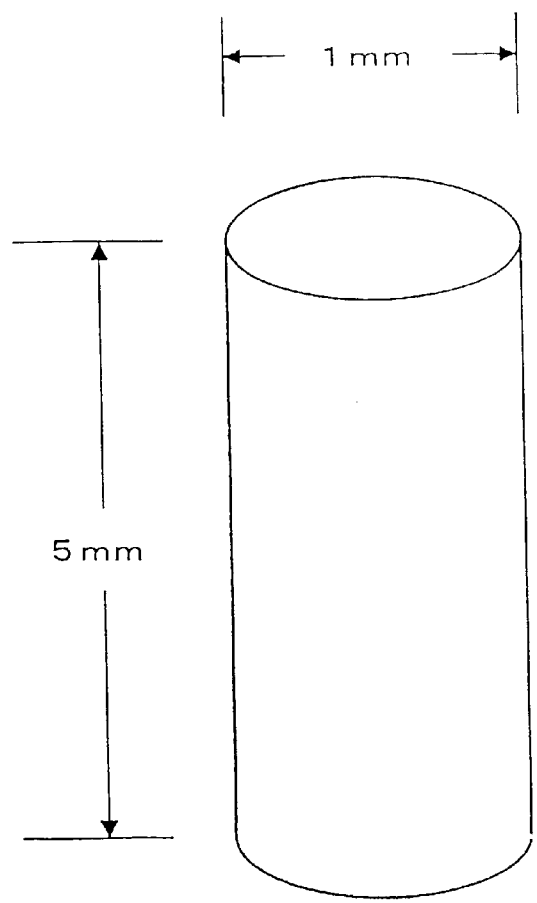
FIG. 1 is a model view showing a Pt cylindrical rod used for measurement of a linear expansion coefficient in the Experiment Example.

A method for manufacturing a substrate with an oxide ferroelectric thin film formed thereon according to the present invention mainly includes forming an electrode on a substrate, prebaking the substrate with the electrode formed thereon and forming an oxide ferroelectric thin film on the obtained electrode.

The substrate that can be used for the method of the present invention may be, for example, an element semiconductor substrate such as silicon or germanium, a compound semiconductor substrate such as GaAs or ZnSe, a metal substrate such as Pt, a sapphire substrate, an MgO substrate, or a dielectric substrate such as $SrTiO_3$ or $BaTiO_3$.

Among these, a silicon substrate, especially a single crystal silicon substrate, is preferable.

The stress of the electrode formed on the substrate determines the crystallinity and the orientation of an oxide ferroelectric thin film formed thereon, so that the electrode is preferably made of at least one kind of an electrically conductive material having a linear expansion coefficient that varies with temperature. Especially, the electrode is preferably formed of an electrically conductive material having distinctly different expansion properties in a plurality of temperature ranges. Also, in view of reducing a thermal treatment temperature in a manufacturing step, the electrode is more preferably formed of an electrically conductive material having the above-mentioned liner expansion properties within the temperature range from about room temperature to about 700° C.

Such an electrically conductive material may be, for example, a single layer or a laminated layer of a metal such as Pt, Au, Al or Ru, or an oxide conductor such as $lrO_2$ or $RuO_2$. Among these, Pt is preferable. The thickness of the electrically conductive material is not specifically limited and may be, for example, about 100 nm to 200 nm. The electrically conductive material may be formed on the substrate by a known method such as the sputtering method, the vacuum vapor deposition method or the like.

For the electrode, it is preferable that an electrically conductive material that prevents generation of an ordinary dielectric pyrochlore phase in the oxide ferroelectric thin film to be formed on the electrode is laminated on the electrically conductive material having the above-mentioned properties. Such an electrically conductive material may be, for example, Ir or the like. The thickness of the electrically conductive material is not specifically limited and may be, for example, about 100 nm to 200 nm. The electrically conductive material may be formed by a method similar to the one mentioned above.

A dielectric layer or the like may be disposed between the substrate and the electrode to ensure electric insulation between the substrate and the electrode. Also, a bonding layer or the like may be disposed to ensure a bonding strength of the electrode with the substrate (or the dielectric layer). The dielectric layer may be, for example, $SiO_2$ or SiN. The dielectric layer may be formed to an appropriate thickness by various known methods such as the thermal oxidation method, the sputtering method, the vacuum vapor deposition method or the MOCVD method. The bonding layer may be formed of, for example, Ta or Ti. The bonding layer may be formed by various known methods such as the sputtering method or the vacuum vapor deposition method.

It is necessary that the temperature for prebaking the substrate with the electrode formed thereon is set according to the change in the thermal expansion coefficient of the electrically conductive material constituting the electrode, with temperature. This enables controlling the crystallinity and/or the orientation of the oxide ferroelectric thin film to be formed on the electrode, as mentioned later.

Figure 2:
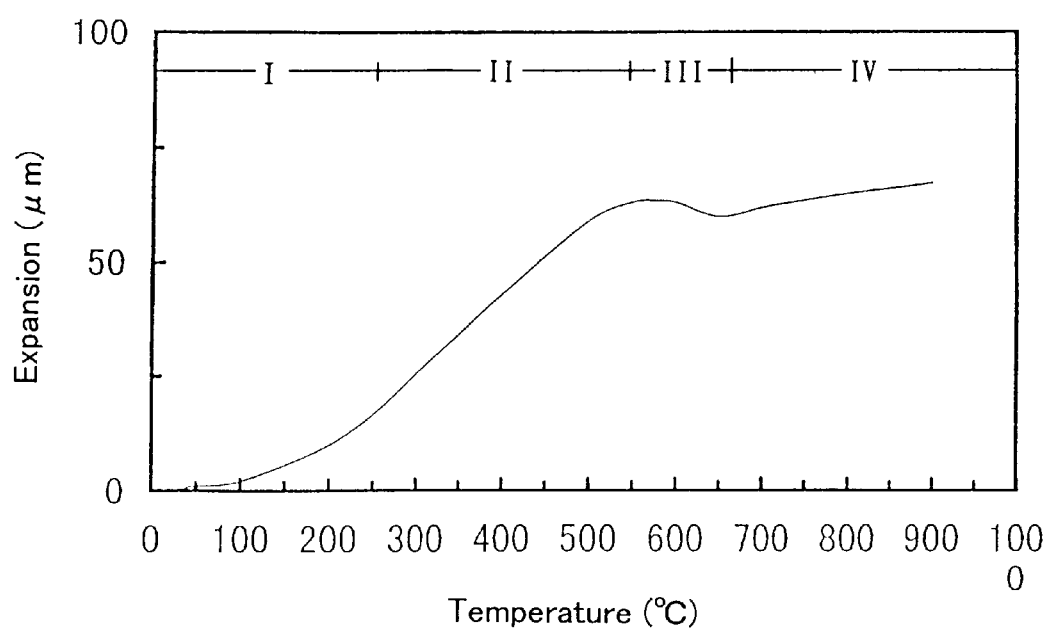
FIG. 2 is a graph showing a temperature-dependent curve of the linear expansion of the Pt cylindrical rod of FIG. 1.

For example, Pt shows four different expansion properties in accordance with the change in temperature, as shown in FIG. 2. Therefore, the substrate is preferably prebaked in a temperature range showing a positive thermal expansion coefficient or in a temperature range showing a negative thermal expansion coefficient so that the oxide ferroelectric thin film formed thereon may have an appropriate crystallinity and/or orientation. Specifically the substrate is preferably prebaked at a temperature within the range from room temperature to 700° C. Especially, if the electrode is made of Pt, the substrate is preferably prebaked at a temperature within the range of 200° C. or more and less than 700° C., more preferably of 250° C. or more and less than 660° C. If the electrode is formed of a laminate structure, the temperature range showing a positive thermal expansion coefficient is preferably a temperature range in which at least one electrically conductive materials constituting the laminate structure show a positive thermal expansion coefficient; and the temperature range showing a negative thermal expansion coefficient is preferably a temperature range in which at least one kind of the electrically conductive materials constituting the laminate structure shows a negative thermal expansion coefficient. For the above temperature range, the prebaking time is preferably about 1 minute to 30 minutes.

The oxide ferroelectric thin film is formed on the obtained electrode. The kind of the oxide ferroelectric thin film to be formed on the obtained electrode is not specifically limited. Namely, in view of the mechanism for controlling the crystallinity or the orientation as later mentioned, it is effective in the method of the present invention to use an oxide ferroelectric material represented by $RMO_3$ (wherein R and M are metal elements) such as PZT, $BaTiO_3$ or $LiNbO_3$ because it assumes a perovskite structure. Also, it is effective in the method of the present invention to use an oxide ferroelectric material such as $Bi_4Ti_3O_{12}$ as well as the oxide material represented by the chemical formula $RMO_3$ because the oxide ferroelectric material such as $Bi_4Ti_3O_{12}$ assumes a perovskite structure similar to PZT or the like, although the oxide ferroelectric material such as $Bi_4Ti_3O_{12}$ or the like has different angles between a-, b-, and c-crystal axes from PZT or the like of trigonal system because its crystal phase assumes a rhombic system.

The oxide ferroelectric thin film may be formed by various known methods such as the sol-gel method, the MOCVD method, the sputtering method or the like. Among these, the sol-gel method is preferable. Further, after the oxide ferroelectric thin film is formed, the obtained thin film is preferably crystallized. The oxide ferroelectric thin film is preferably crystallized by a thermal treatment of a temperature and time that do not affect the crystallinity and/or the orientation of the oxide ferroelectric thin film. Specifically, the oxide ferroelectric thin film may be crystallized, for example, at a temperature within the range from about 500 to about 850 ° C. for a period of time within the range from about 1 to about 30 minutes, although they may be suitably adjusted in accordance with the kind, the thickness or the like of the oxide ferroelectric thin film to be formed. Here, although the temperature for crystallization is preferably lower than the prebaking temperature, it may be higher than the prebaking temperature as long as it does not affect the crystallinity and/or the orientation of the oxide ferroelectric thin film.

The above method may produce a substrate with an oxide ferroelectric thin film formed thereon having substantially a single (111) crystal orientation. Also, it may produce a substrate with an oxide ferroelectric thin film formed thereon having a residual polarization value within the range from 20 $\mu C/cm^2$ to 30 $\mu C/cm^2$. Further, it may produce a substrate with an oxide ferroelectric thin film formed thereon having a coercive field value within the range from 40 kV/cm to 60 kV/cm.

Hereafter, embodiments of the method for manufacturing a substrate with an oxide ferroelectric thin film formed thereon and the substrate with the oxide ferroelectric thin film formed thereon according to the present invention will be explained with reference to the attached drawings.

EXPERIMENT EXAMPLE

Measurement of Linear Expansion Coefficient of Pt Bulk Material (99.99999%)

A Pt bulk material (99.99999%) was processed into a cylindrical shape as shown in FIG. 1, and a temperature-dependent curve of its linear expansion was measured. The result is shown in FIG. 2.

Here, in view of adaptation to a semiconductor process, the upper limit temperature in each step of fabricating the oxide ferroelectric thin film is about 700° C. In this Experiment Example, the experiment was conducted at a temperature of 900° C. or less including the above-mentioned temperature range.

As will be clearly understood from FIG. 2, the temperature-dependent curve of the linear expansion of Pt is not a monotonous curve and changes in a complex manner. The linear expansion coefficient of Pt is given by a gradient of the temperature-dependent curve of linear expansion shown in FIG. 2, and therefore can be divided into the following temperature ranges.

I: Temperature 250° C. or less. The temperature-dependent curve of linear expansion is not linear but is a downwardly convex curve. The linear expansion coefficient is not constant but increases in accordance with the rise in temperature.

II: Temperature between 250° C. and 540° C. The temperature-dependent curve of linear expansion is almost linear. The linear expansion coefficient is almost constant and is $1.7 \times 10^{-5}$ cm/°C.

III: Temperature between 540° C. and 660° C. The temperature-dependent curve of linear expansion has a negative gradient. The linear expansion coefficient is a negative value.

IV: Temperature 660° C. or more. The gradient of the temperature-dependent curve of linear expansion is extremely moderate. The linear expansion coefficient is barely a positive value.

EXAMPLE 1

Method of Fabricating a Lower Electrode and Thermal Treatment Conditions

Figure 3:
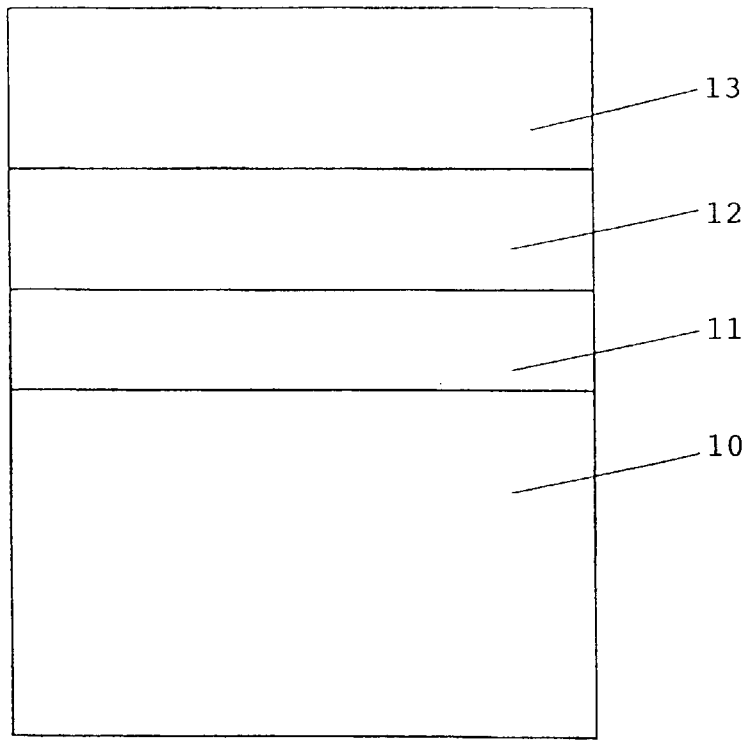
FIG. 3 is a schematic cross-sectional view showing a structure of a substrate with a Pt electrode formed thereon.

Referring to FIG. 3, a surface of a silicon (Si) single crystal substrate 10 was thermally oxidized to form a silicon dioxide ($SiO_2$) layer 11 having a thickness of about 200 nm. A tantalum (Ta) layer 12 serving as a bonding layer was formed to a thickness of about 30 nm on the $SiO_2$ layer 11. Further, the same platinum (Pt) bulk material (99.99999%) formed in the Experiment Example was deposited to a thickness of about 200 nm on the tantalum layer 12 at room temperature by the sputtering method, thereby to form a Pt electrode 13.

Subsequently, the resultant silicon substrate 10 including the Pt electrode 13 (hereafter referred to as "Pt-formed substrate") was prebaked in an $N_2$ atmosphere for 30 minutes under seven types of temperature conditions selected from the four temperature regions shown in FIG. 2 in which the linear expansion coefficient of the Pt bulk material behaves in different manners. The seven types of temperature conditions are shown in Table 1.

TABLE 1

| Sample | Prebaking temperature | Temperature range |
|---|---|---|
| A | As grown (without baking) | I |
| A-1 | 200° C. | I |
| B | 300° C. | II |
| B-1 | 400° C. | II |

TABLE 1-continued

| Sample | Prebaking temperature | Temperature range |
|---|---|---|
| B-2 | 500° C. | II |
| C | 600° C. | III |
| D | 700° C. | IV |

Figure 4:
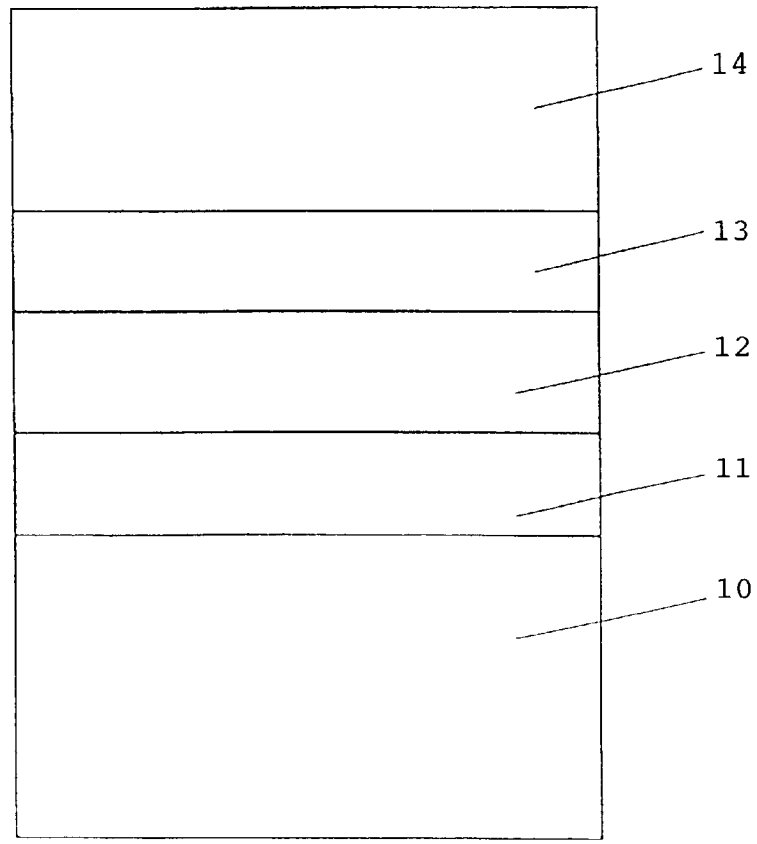
FIG. 4 is a schematic cross-sectional view showing a structure of a substrate with an oxide ferroelectric thin film formed thereon according to the present invention.

Further, referring to FIG. 4, a ferroelectric thin film 14 made of PZT and having a thickness of about 200 nm was formed under the following film-forming conditions by the sol-gel method on each of the Pt-formed substrates 10 prebaked at seven kinds of baking temperatures.

A material metal alkoxide containing 10 wt % of PZT (Pb:Zr:Ti=110:52:48) was prepared as a sol-gel material solution. The alkoxide contained Pb at 7.1 wt % as PbO, Zr at 1.8 wt % as $ZrO_2$, and Ti at 1.1 wt % as $TiO_2$. As a solvent, 2-methoxyethanol was used so that the solvent occupied 50% or more of the total amount.

The sol-gel solution was applied onto the Pt-formed substrate 10 by the spin coating method (Spin coating condition:rotation at 500 rpm for 3 seconds and then rotation at 3000 rpm for 15 seconds). Subsequently, the substrate 10 was dried at 150° C. in an ambient atmosphere for one minute, and then the temperature was raised to 400° C. in the ambient atmosphere for provisional calcination for 10 minutes to finish the first film-forming operation. After this process is repeated for five times, a final calcination (crystallization, once) was carried out by an RTA treatment at 700° C. for five minutes in an oxygen atmosphere. The total thickness of the PZT thin film was about 250 nm.

Among these seven samples, Sample A (as grown), Sample B (300° C.), Sample C (600° C.) and Sample D (700° C.) were selected as representative samples showing the difference in properties accompanying the pretreatment by prebaking the Pt-formed substrate 10 in the four temperature regions shown in FIG. 2 in which the linear expansion coefficient of the Pt bulk material behaves in different manners. The PZT surface morphology and the cross-sectional photograph of the Pt electrode 13 were observed for each of the four Samples A, B, C and D. Table 2 shows a structure of the Pt electrode 13 and a structure of the PZT thin film in each of the four Samples A, B, C and D. The samples in which the substrate was prebaked at 200° C. had a property similar to the Sample A, and the samples in which the substrate was prebaked at 400° C. or 500° C. had properties similar to that of the Sample B.

TABLE 2

| | Prebaking Temp. | Structure of Pt electrode | Structure of PZT thin film |
|---|---|---|---|
| A | As grown | Like a single plate without a structure. | Aggregates of large grains Having a diameter of about 500 nm |
| B | 300° C. | Like a single plate but a columnar structure is beginning to appear. | Aggregates of large grains Having a diameter of about 500 nm but each grain shape is definite |
| C | 600° C. | Dense columnar structure. | Dense and flat. Large grains are not present. |
| D | 700° C. | Extremely uneven granular structure. | Dense and flat, but unevenness having a diameter of 100 to 200 nm is present at some places. |

From the above Table 2, it will be understood that the structure of the Pt electrode 13 of each sample was different in correspondence with the structure of the PZT thin film although all of the four samples A, B, C and D had undergone the same calcination step by RTA of the same condition at 700° C. for five minutes. From this, it is shown that the structure changes only in accordance with the prebaking treatment.

In other words, in correspondence with the four different behaviors of the linear expansion coefficient of the Pt bulk material, the Pt electrode 13:(1) was like a single plate if the substrate was prebaked within the temperature range of the I (Sample A); (2) was like a single plate in which some columnar structure was beginning to appear if the substrate was prebaked within the temperature range of the II (Sample B); (3) had a columnar structure if the substrate was prebaked within the temperature range of the III (Sample C); and (4) had a granular structure if the substrate was prebaked within the temperature range of the IV (Sample D).

The PZT thin film also shows a different structure in correspondence with the four different behaviors of the linear expansion coefficient of the Pt bulk material in the same manner as the Pt electrode 13, although the PZT thin films of all of the four Samples A, B, C and D have a dense and flat surface. In other words, the PZT thin film: (1) was an aggregates of large grains if the substrate was prebaked within the temperature range of the I (Sample A); (2) was an aggregates of large grains with each grain having a definite shape if the substrate was prebaked within the temperature range of the II (Sample B); (3) was extremely dense and flat in which large grains did not exist if the substrate was prebaked within the temperature range of the III (Sample C), and (4) had a dense and flat surface in which unevenness was present at some places if the substrate was prebaked within the temperature range of the Region IV (Sample D).

From the above observation, it has been found out that the behavior of the linear expansion coefficient and the structure of the Pt electrode are closely related to each other and, as a result, strongly affect the structure and morphology of the PZT thin film formed thereon.

Figure 5:
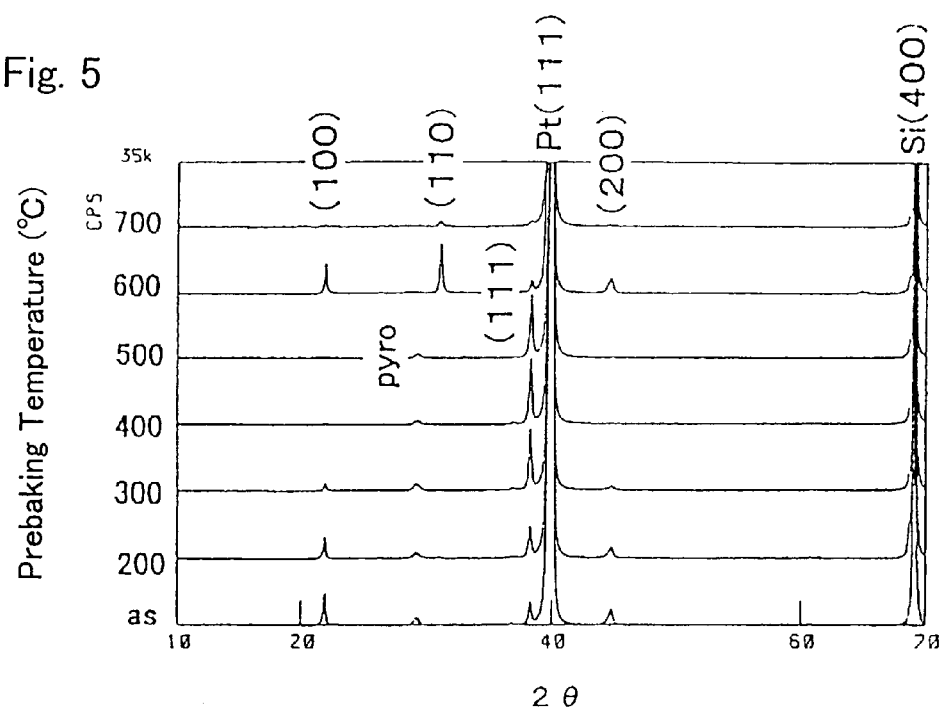
FIG. 5 is a view showing an XRD pattern of the oxide ferroelectric thin film in FIG. 4.

Further, an X-ray diffraction measurement was carried out for each of the seven Samples. FIG. 5 shows its XRD patterns.

From FIG. 5, it will be understood that the orientation of the PZT thin film differs greatly depending on the prebaking temperature of the Pt electrode.

Figure 6:
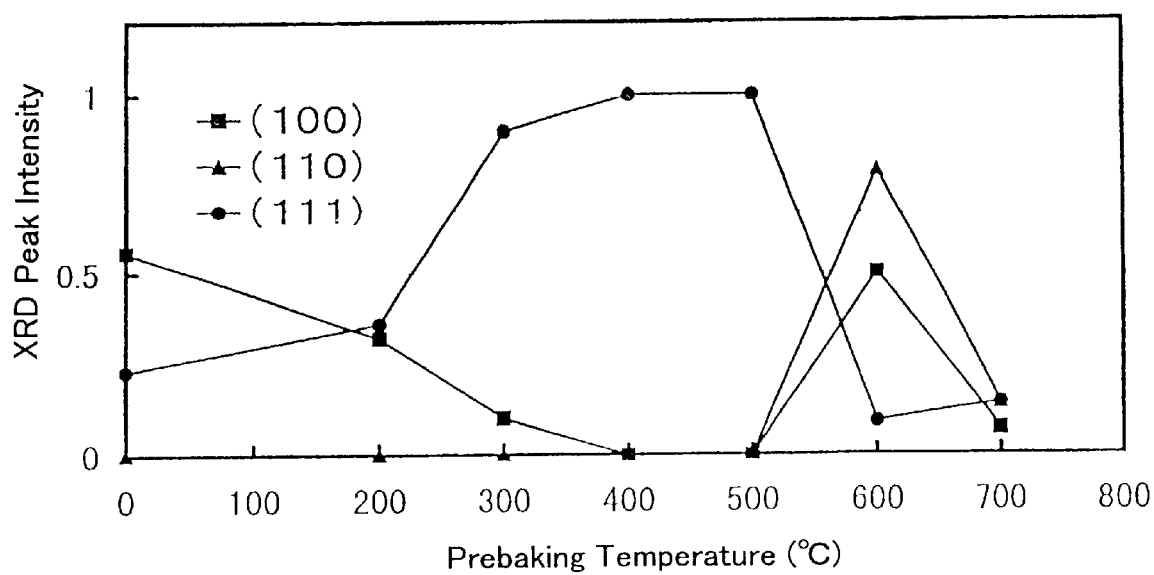
FIG. 6 is a view showing a relationship between an XRD peak intensity of an oxide ferroelectric thin film and a prebaking temperature.

To make it more understandable, XRD peak intensities were plotted in FIG. 6.

From FIG. 6, it will be understood that the orientation of the PZT thin film changes greatly depending on the prebaking temperature, and therefore, the structure of the Pt electrode.

In other words, in correspondence with the four different behaviors of the linear expansion coefficient of the Pt bulk material, the PZT thin film has the following orientation.
(1) In the case where the substrate was prebaked within the temperature range of the I (200° C. or less) (the region in which the Pt lower electrode was like a single plate), the PZT thin film had a (100) dominant orientation including (111) in the sample as grown (Sample A). For the sample in which the prebaking temperature was 200° C., the (111) component was stronger and, at the same time, the (100) component was weaker as compared with the sample as grown (Sample A). This seems to be because the prebaking temperature came near to the temperature range of the II to make the (111) component stronger, as will be explained later.
(2) In the case where the substrate was prebaked within the temperature range of the II (250° C. to 540° C. ) (the region in which the Pt lower electrode was like a single plate beginning to have a columnar structure to some extent), the PZT thin film had an almost single (111) orientation in all of the samples in which the prebaking temperature was 300° C. (Sample B), 400° C. or 500° C.
(3) In the case where the substrate was prebaked within the temperature range of the III (540° C. to 660° C. ) (the region in which the Pt electrode had a columnar structure), the PZT thin film had a (110) dominant orientation in the Sample C in which the prebaking temperature was 600° C.
(4) In the case where the substrate was prebaked within the temperature range of the IV (660° C. or more) (the region in which the Pt lower electrode had a granular structure having unevenness at some places), the PZT thin film still maintained the (110) dominant orientation in the Sample D in which the prebaking temperature was 700° C. However, the Sample D showed the lowest crystallinity among the seven samples.

EXAMPLE 2

Fabrication of a Capacitor

Figure 7:
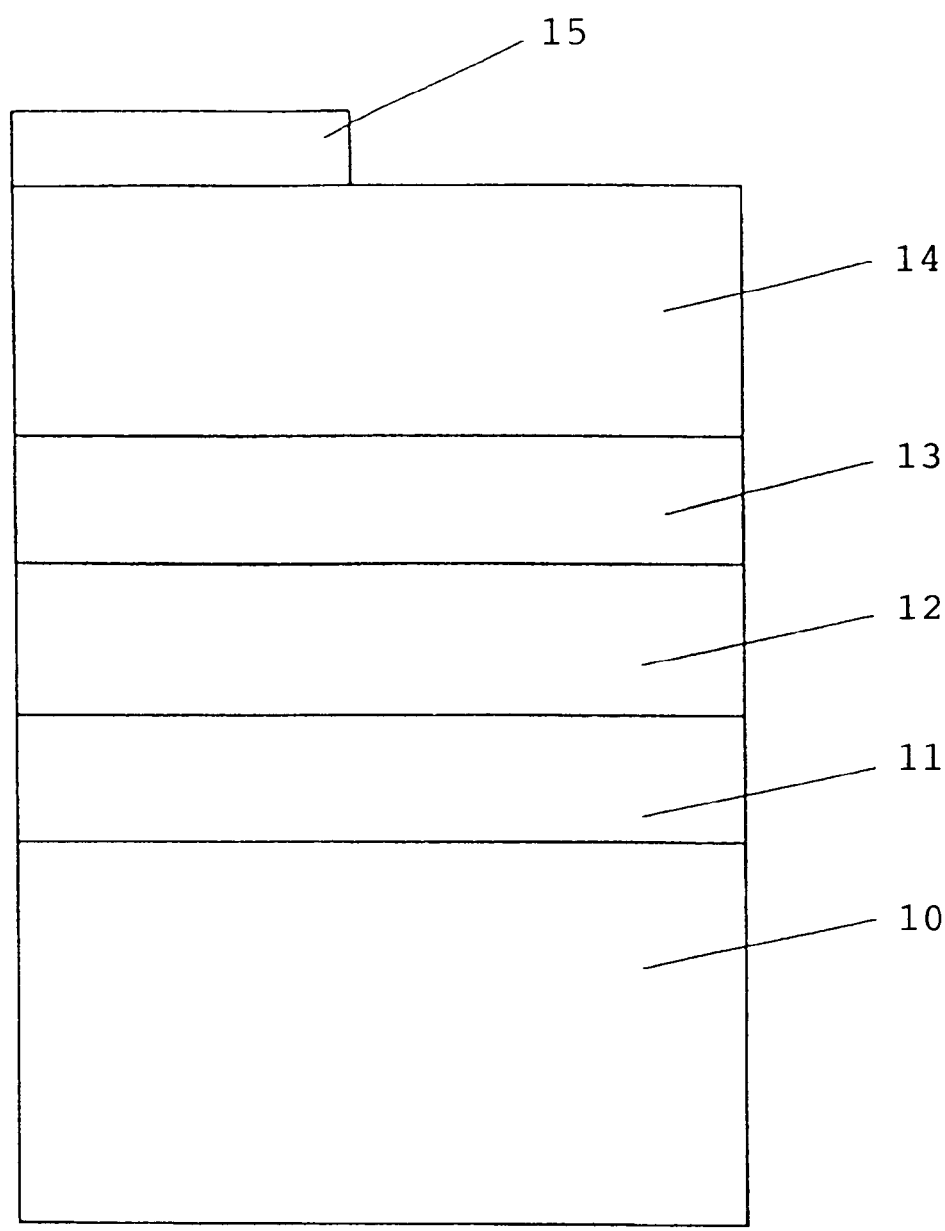
FIG. 7 is a cross-sectional model view showing a structure of a capacitor using a substrate with an oxide ferroelectric thin film formed thereon fabricated according to the present invention.
Figure 8:
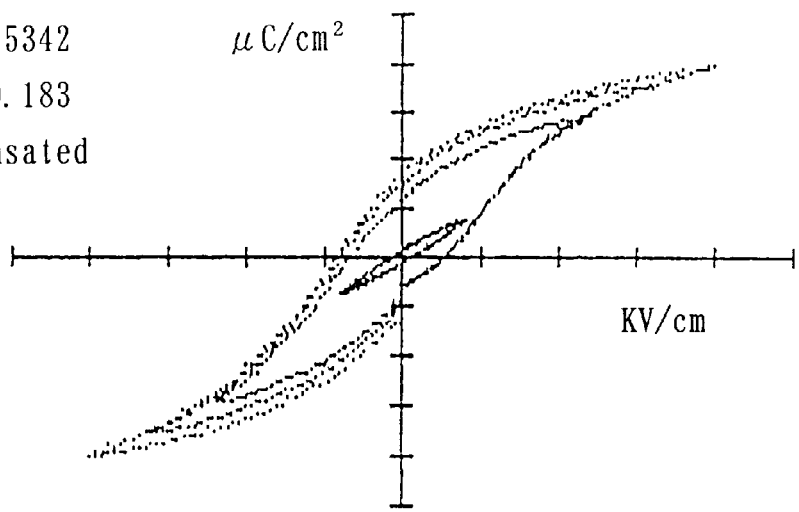
FIG. 8 is a view showing a ferroelectric hysteresis property of a capacitor fabricated without prebaking the electrode.
Figure 9:
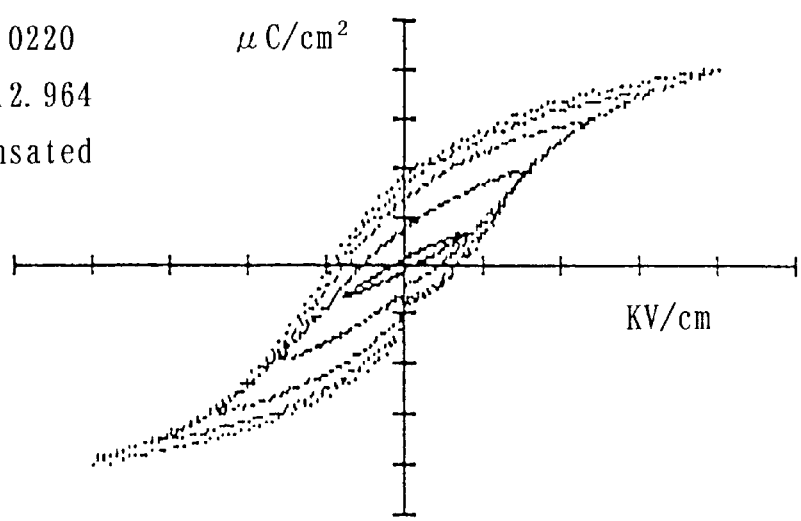
FIG. 9 is a view showing a ferroelectric hysteresis property of a capacitor fabricated by prebaking the electrode at 200° C.
Figure 10:
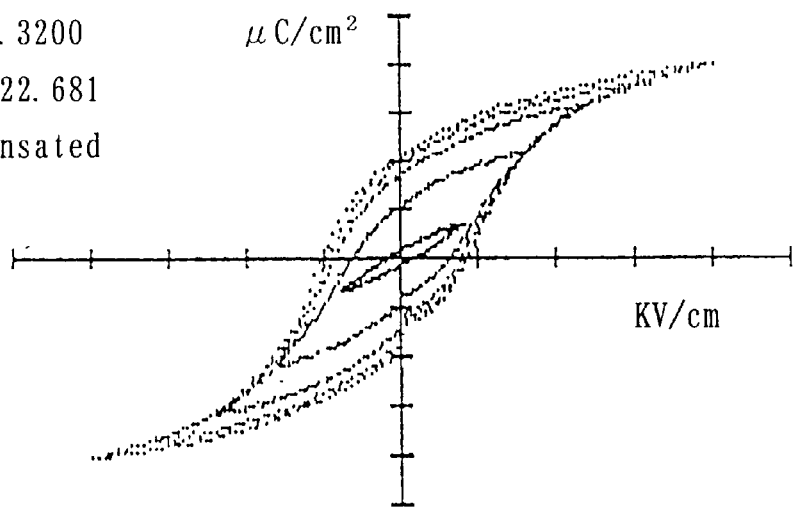
FIG. 10 is a view showing a ferroelectric hysteresis property of a capacitor fabricated by prebaking the electrode at 300° C.
Figure 11:
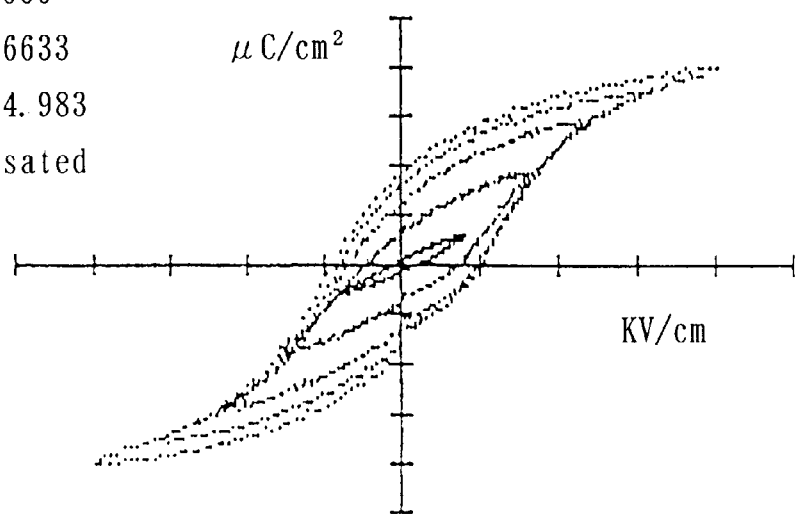
FIG. 11 is a view showing a ferroelectric hysteresis property of a capacitor fabricated by prebaking the electrode at 400° C.
Figure 12:
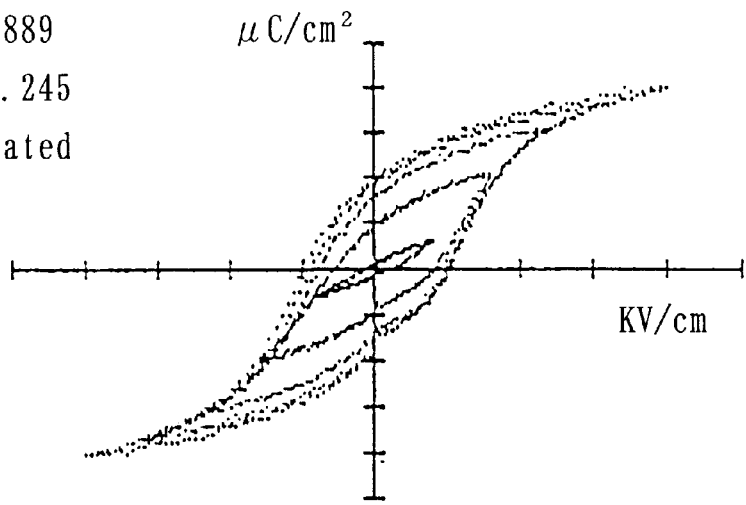
FIG. 12 is a view showing a ferroelectric hysteresis property of a capacitor fabricated by prebaking the electrode at 500° C.
Figure 13:
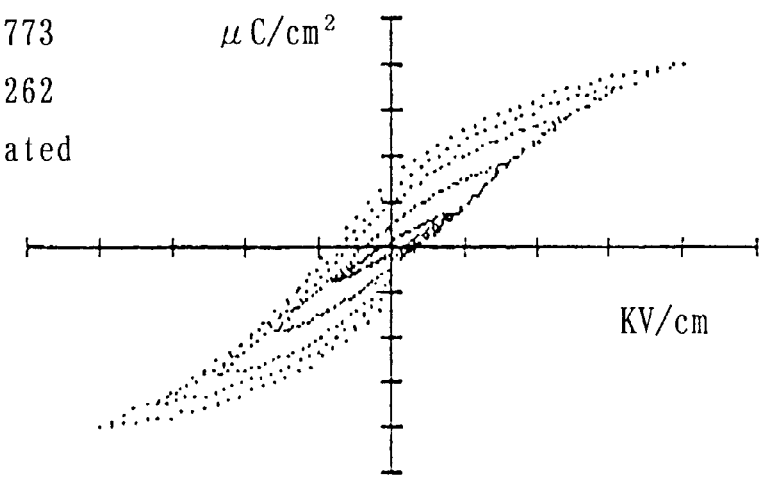
FIG. 13 is a view showing a ferroelectric hysteresis property of a capacitor fabricated by prebaking the electrode at 600° C.
Figure 14:
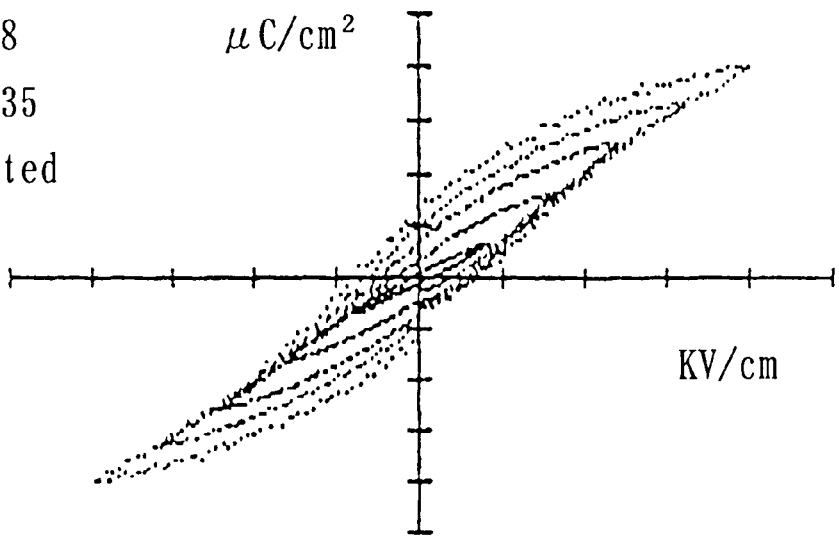
FIG. 14 is a view showing a ferroelectric hysteresis property of a capacitor fabricated by prebaking the electrode at 700° C.

Referring to FIG. 7, a Pt upper electrode 15 was formed to a thickness of about 100 nm on each of seven types of silicon substrates 10 having a ferroelectric film 14 formed on seven types of Pt electrodes 13 of Example 1 acting as lower electrodes. Ferroelectric properties of a capacitor having the ferroelectric thin film 14 sandwiched between the Pt electrode 13 and the Pt electrode 15 were evaluated.

FIGS. 8 to 14 show ferroelectric hysteresis properties of the seven types of the capacitors. In FIGS. 8 to 14, hysteresis curves for the maximum applied voltages of 1, 2, 3, 4 and 5V are superposed for comparison. These show different properties dependent on the orientations (prebaking temperature ranges).

Among these, Samples A, B, C and D were selected as representative samples showing the orientations (prebaking temperature ranges) for measurement of the coercive field Ec and the residual polarization Pr for each of the maximum applied voltages. The results are shown in FIGS. 15(*a*) and 15(*b*).

Figure 15:
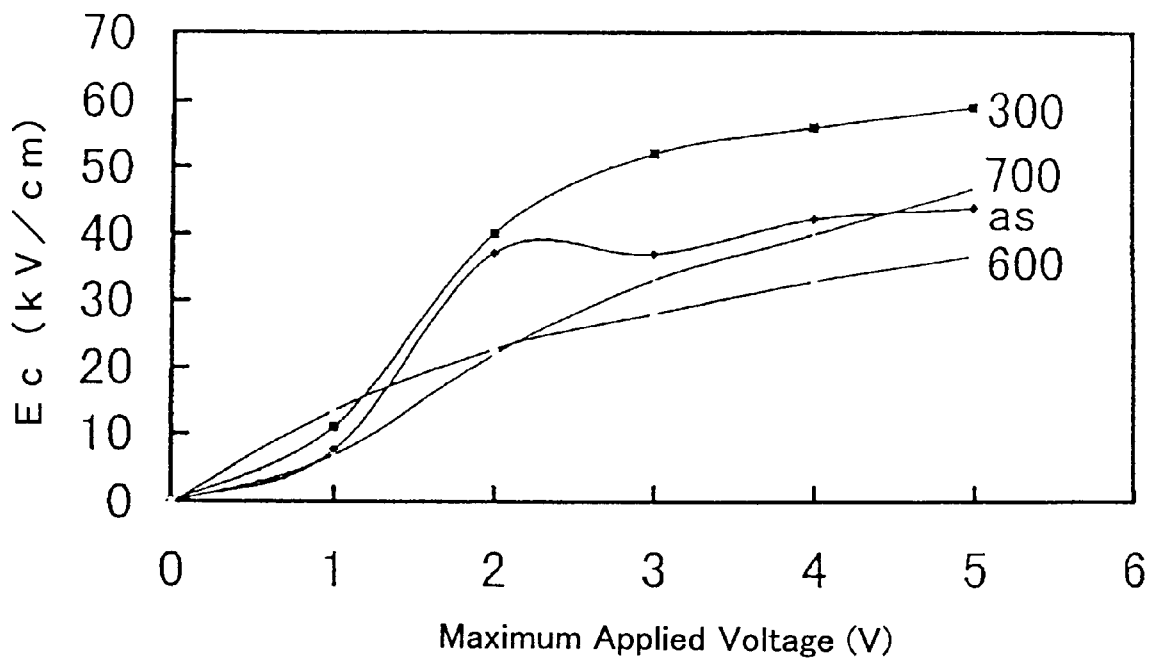
FIG. 15(a) is a view showing a relationship between the maximum applied voltage and a coercive field Ec of capacitors based on a ferroelectric hysteresis property.
FIG. 15(b) is a view showing a relationship between the maximum applied voltage and a residual spontaneous polarization Pr of capacitors based on a ferroelectric hysteresis property.
Figure 15:
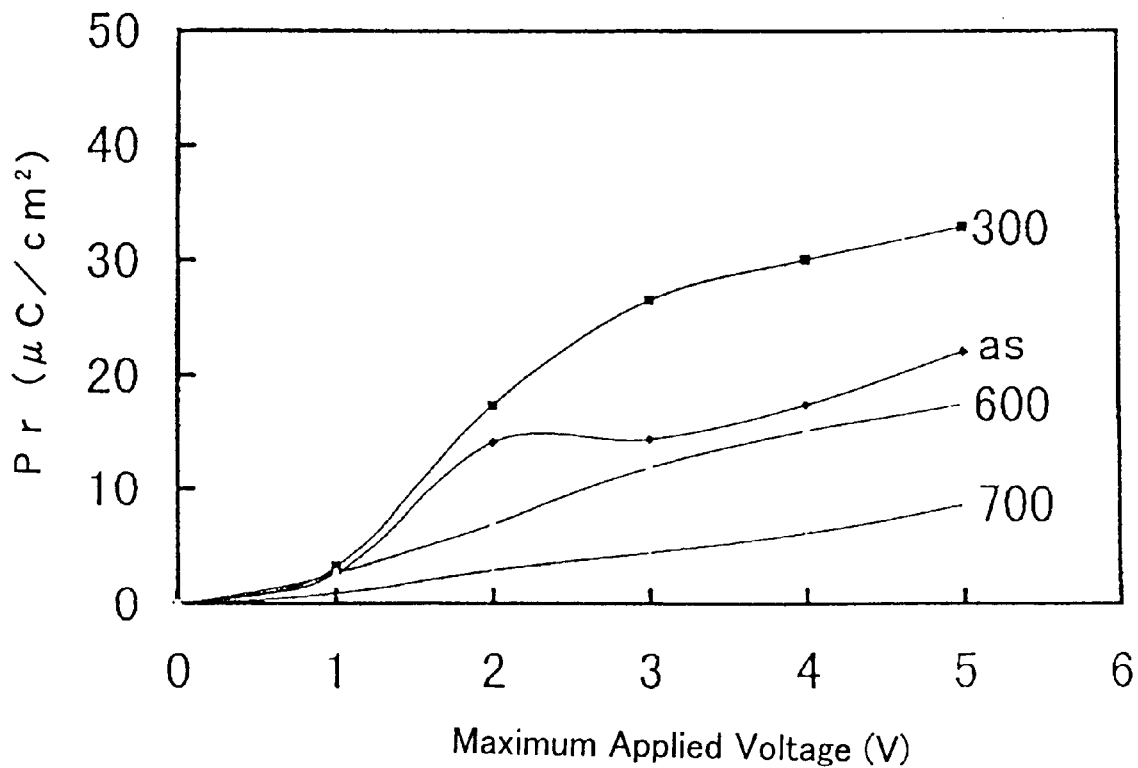

As will be clearly understood from FIGS. 15(*a*) and 15(*b*), the Sample A (as grown) showed saturation of the residual polarization Pr at the smallest voltage of 2V. The Sample B (prebaked at 300° C. )showed the largest residual polarization Pr of 30 $\mu C/cm^2$ or more, and a comparatively good saturation property in which the residual polarization was almost completely saturated at the maximum applied voltage of 3V or more. The Sample C (prebaked at 600° C. ) did not show a tendency of saturation for any of the residual polarization Pr and the coercive field Ec. In the Sample C, the residual polarization Pr and the coercive field Ec increase in accordance with the rise in the maximum applied voltage. However, its coercive field Ec is the smallest, and the residual polarization Pr has a comparatively large value of approximately 20 $\mu C/cm^2$. The Sample D (prebaked at 700° C. ) had a small residual spontaneous polarization Pr and a large coercive field Ec, reflecting the low crystallinity.

Figure 16:
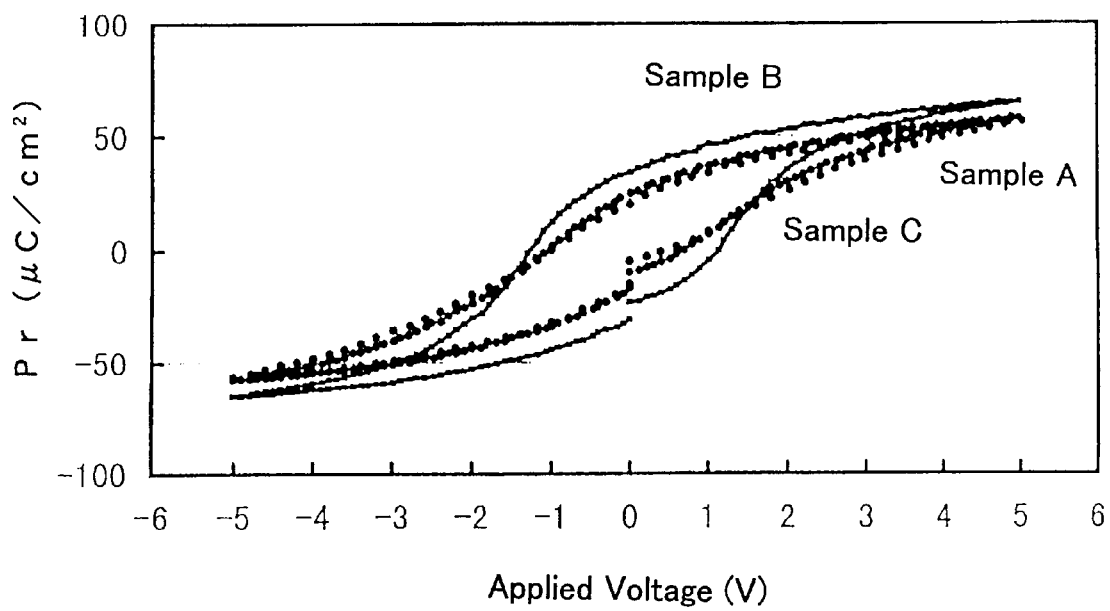
FIG. 16(a) is a view showing a ferroelectric hysteresis property of capacitors based on a ferroelectric hysteresis property.
FIG. 16(b) is a view showing a ferroelectric hysteresis property of capacitors based on a ferroelectric hysteresis property.
Figure 16:
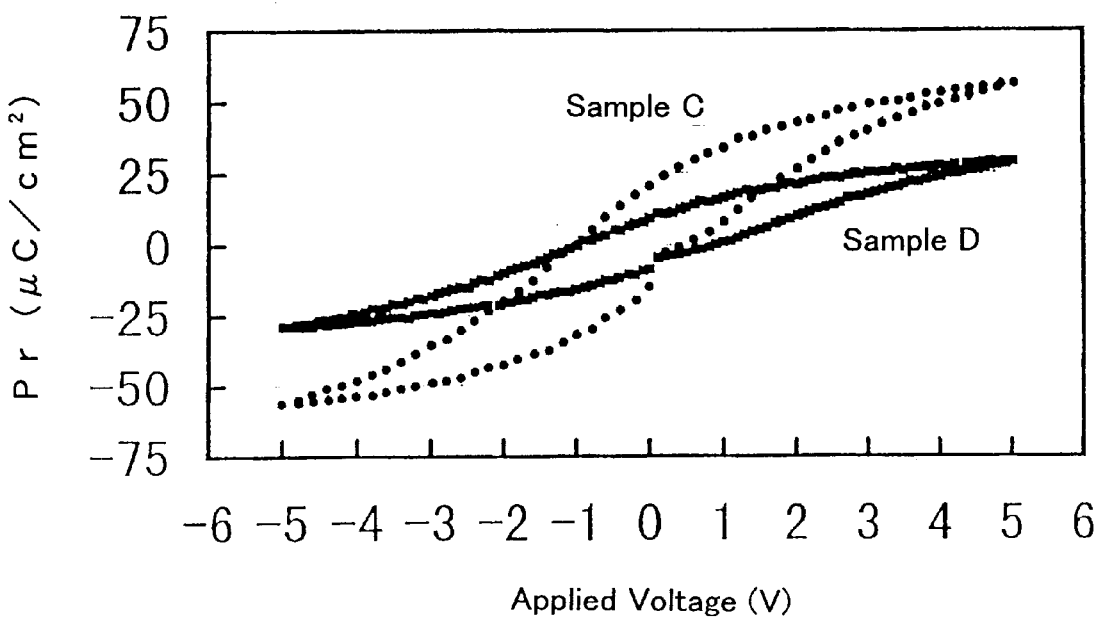

FIG. 16(*a*) shows ferroelectric hysteresis curves, which are superposed, for the Samples A, B and C at the maximum applied voltage of 5V. The Sample B showed the largest residual spontaneous polarization Pr, and its hysteresis curve showed the best angular (rectangle-like) shape. Although the hysteresis curves for the Samples A and B seem to be overlapped, their saturation properties are greatly different from each other. This seems to be merely because the hysteresis curves for the maximum applied voltage of 5V happened to be very similar to each other.

FIG. 16(b) shows ferroelectric hysteresis curves of the Samples C and D for the maximum applied voltage of 5V. The hysteresis curve of the Sample D clearly reflects its low crystallinity.

As will be understood from above, the varying behavior of thermal expansion coefficient of the lower electrode material, the change in the electrode material structure in accordance therewith, and the change in the orientation of the ferroelectric thin film formed thereon are correlated with each other. Therefore, the orientation and the ferroelectric properties of the ferroelectric thin film can be controlled by prebaking the substrate based on a measurement of the behavior of the linear expansion coefficient of the lower electrode material before the ferroelectric thin film is formed.

It appears that a stress exerted on the ferroelectric thin film plays an important role in this mechanism of orientation control.

As has been explained in the Experiment Example, the linear expansion coefficient of the lower electrode (1) assumes positive values in the temperature range of I (250° C. or less) and increases as the temperature rises, (2) assumes a constant positive value in the temperature range of II (250° C. to 540° C.) and attains the largest value among all the temperature ranges, (3) assumes negative values in the temperature range of III (540° C. to 660° C.), and (4) assumes small positive values in the temperature range of IV (660° C. or more). It seems that, since the electrode subjected to a prebaking treatment for each of the temperature ranges has a respective crystal structure corresponding to the prebaking temperature, the linear expansion coefficient of the electrode at the calcination step of the ferroelectric thin film assumes a value near to that of the prebaking temperature instead of the value in its original (virgin) state.

At the calcination step of the ferroelectric thin film of the Example 1, the PZT thin film is crystallized to shrink its volume. Against this, the lower electrode of the sample subjected to the prebaking treatment (1), (2) or (4), in which the linear expansion coefficient assumes positive values, acts to expand itself in the calcination step, generating a tensile stress in the PZT thin film. The lower electrode of the sample subjected to the prebaking treatment (3), in which the linear expansion coefficient assumes negative values, acts to contract itself in the calcination step, whereby contraction of the PZT thin film is promoted or, even if it generates a tensile stress, only a weak tensile stress is generated.

To explain it in more detail, (1) the electrode of the sample prebaked in the temperature range of I has a positive thermal expansion coefficient which increases as the prebaking temperature rises, so that an increasing tensile stress is exerted on the PZT thin film as the prebaking temperature rises; (2) the electrode of the sample prebaked in the temperature range of II has a positive constant thermal expansion coefficient and assumes the largest value, so that the largest constant tensile stress is exerted on the PZT thin film irrespective of the prebaking temperature; (4) the electrode of the sample prebaked in the temperature range of IV has a small positive thermal expansion coefficient, so that only a small tensile stress is exerted on the PZT thin film. It seems that, in the Sample D subjected to the prebaking treatment at 700° C., the lower electrode does not have any influence on the PZT thin film at the calcination temperature of 700° C. and, as a result, the crystallinity, the orientation and the ferroelectric properties of the Sample D were inferior.

(3) The electrode of the sample prebaked in the temperature range of III has a negative thermal expansion coefficient, so that, even if a tensile stress is exerted on the PZT thin film, only a weak tensile stress is exerted.

The above study explains the relationship between the prebaking temperature and the XRD peak intensity, especially the (111) intensity well.

In the case where the thermal expansion coefficient of the lower electrode assumes a positive value (I,II and IV), a tensile stress is exerted on the PZT thin film, whereby the (111) orientation component is generated and its magnitude is proportional to the magnitude of the thermal expansion coefficient. In other words, (1) in the samples prebaked in the temperature range of I, a tensile stress that increases in accordance with the rise of the prebaking temperature is exerted on the PZT thin film, so that the (111) orientation component grows larger as the prebaking temperature rises; (2) in the samples prebaked in the temperature range of II, the largest constant tensile stress is exerted on the PZT thin film irrespective of the prebaking temperature, so that the maximum and almost constant (111) orientation component is generated; and (4) in the samples prebaked in the temperature range of IV, only a small tensile stress is exerted on the PZT thin film, so that the (111) orientation component is extremely small.

Further, (3) in the samples prebaked in the temperature range of III, the thermal expansion coefficient assumes negative values. In this case, a (110) orientation component tends to be generated.

In addition, in the ranges (I, III) where the thermal expansion coefficient changes in accordance with the prebaking temperature, a (100) orientation component is generated irrespective of whether the thermal expansion coefficient is positive or negative.

EXAMPLE 3

Comparison of Electrode Ir with Electrode Pt

In this Example, a PZT thin film was formed on a substrate with Ir formed thereon by using a technique similar to the one using a substrate with Pt formed thereon in order to examine the orientation of the PZT thin film when an Ir electrode, which is often used as a lower electrode of PZT in addition to Pt, is used.

The structure of the substrate with Ir formed thereon is similar to the one shown in FIG. 3, except that the electrode is made of Ir. This substrate with Ir formed thereon was used as grown (without prebaking) or after prebaking in an $N_2$ atmosphere at a temperature of 300° C. or 600° C. for 30 minutes, in the same manner as the substrate with Pt formed thereon.

Next, a PZT thin film was formed under the same film-forming condition using the same PZT source material solution as in the Example 1. The obtained PZT thin film had a thickness of approximately 250 nm.

Figure 17:
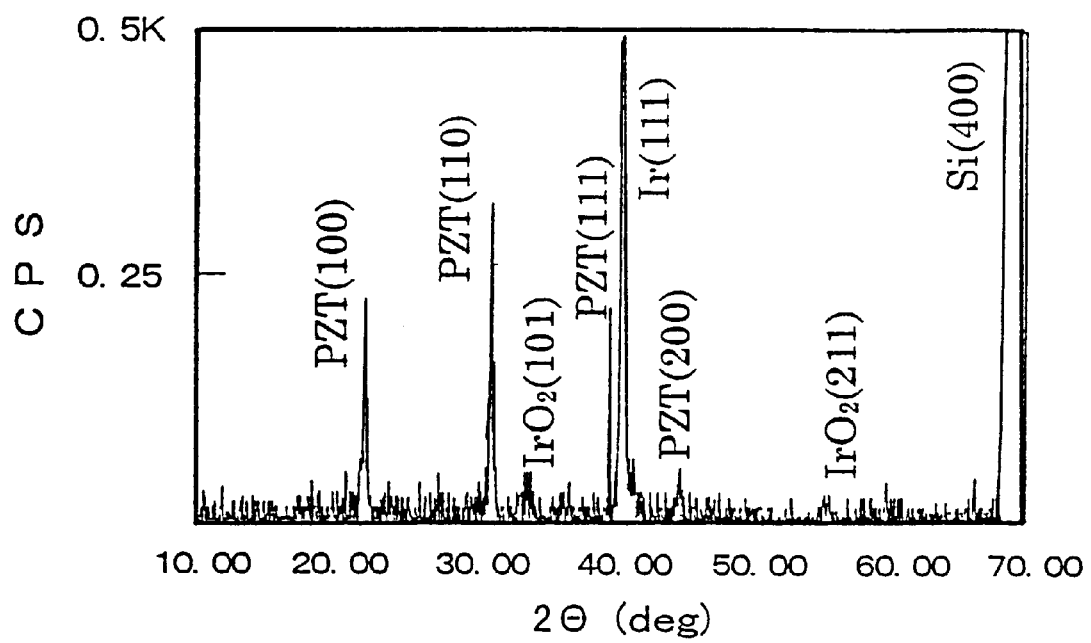
FIG. 17 is a view showing an XRD pattern of an oxide ferroelectric thin film fabricated on an Ir electrode.

FIG. 17 shows an XRD pattern of the PZT thin film on a substrate with Ir formed thereon when the substrate had not been prebaked. Similar results were obtained using a substrate prebaked at a temperature of 300° C. or 600° C. Namely, in the case of a PZT film formed on a substrate with Ir formed thereon, a (110) dominant orientation having (110) and (111) components mixed therein was obtained irrespective of the prebaking condition.

As shown in the Example 1, a Pt electrode shows a structure that varies with the prebaking temperature and gives a varying stress to a PZT film formed thereon, thereby to change the orientation of the PZT thin film located above. On the other hand, it has been confirmed that, unlike the Pt electrode, an Ir electrode always assumes a columnar (pillar) structure irrespective of the prebaking temperature.

In other words, in the case of an Ir electrode, it seems that a (110) dominant randomly-oriented PZT film similar to the PZT thin film on the columnar Pt electrode prebaked at 600° C. is always obtained irrespective of the prebaking temperature.

Further, on comparison between the XRD pattern of the PZT thin film on the Pt electrode of FIG. 5 with the XRD pattern of the PZT thin film on the Ir electrode of FIG. 17, it is found out that the PZT thin film on the Ir electrode has an extremely lower crystallinity. This seems to be because the Ir electrode gives a weaker tensile stress to the PZT thin film as compared with the Pt electrode.

Ir is an extremely fragile metal, and it is difficult to process it into a bar-like (rod-like) shape. Therefore, it was not possible to measure the temperature dependency of linear expansion in the same manner as in the Experiment Example. Instead, a bulk Ir was placed and heated in a heating vessel for measuring the temperature dependency of its dimension by means of a non-contact displacement meter. The observed change in the dimension was small as compared with the linear expansion coefficient of Pt, and it did not have distinctly-partitioned different expansion properties in a plurality of temperature ranges as observed in the case of Pt in the Experiment Example. This may relate to the fact that Ir is a substance liable to be oxidized. At any rate, it seems that, because the Ir electrode gives a smaller stress to the PZT thin film and is constant, a weak (110) oriented PZT thin film was obtained.

EXAMPLE 4

Laminated Electrode Structure

From the XRD pattern of the PZT thin film on the Pt electrode of FIG. 5, it is understood that the PZT thin film on the Pt electrode always includes an ordinary dielectric pyrochlore phase. This result seems to be caused by evaporation of a Pb component from the PZT thin film surface or decrease of the Pb component in the PZT thin film due to generation of an alloy such as Pb-Pt caused by a strong catalyst action of the Pt electrode at an interface between the PZT thin film and the Pt electrode, since Pt is a metal which is so active to be used as a catalyst. On the other hand, as will be understood from FIG. 17, the PZT thin film on the Ir electrode includes little ordinary dielectric pyrochlore phase, though the peak intensities of the PZT thin film are weak as a whole. In other words, the PZT thin film on the Ir electrode has a smaller Pb composition shift.

Therefore, a laminate electrode structure having both of the above mentioned characteristics was prepared and a PZT thin film was formed thereon.

First, a substrate with a laminated electrode formed thereon was prepared by forming an Ir electrode to a thickness of 20 nm at room temperature by the sputtering method on a substrate with Pt formed thereon having a thickness of 200 nm without prebaking (as grown) or after prebaking the substrate at 300° C. or 600° C. for 30 minutes in an $N_2$ atmosphere. Then, a PZT thin film was formed thereon.

In other words, the purpose was to control the orientation of the PZT thin film by using the stress from the Pt electrode while ensuring a good crystallinity, to suppress the generation of an ordinary dielectric pyrochlore phase derived from the change in the PZT composition and to improve the fatigue endurance of the PZT by using the Ir electrode.

A PZT thin film was formed on a substrate with a laminate electrode formed thereon after each prebaking treatment was carried out. A PZT thin film having a (100) dominant orientation was obtained in the case where the substrate had not been prebaked. A PZT thin film having a single (111) orientation was obtained in the case where the substrate had been prebaked at 300° C. A PZT thin film having a (110) dominant orientation was obtained in the case where the substrate had been prebaked at 600° C. All of these three cases showed a good crystallinity.

At the same time, it was found out that the PZT thin film contained only a little of an ordinary dielectric pyrochlore phase for any of the above-mentioned substrates.

Figure 18:
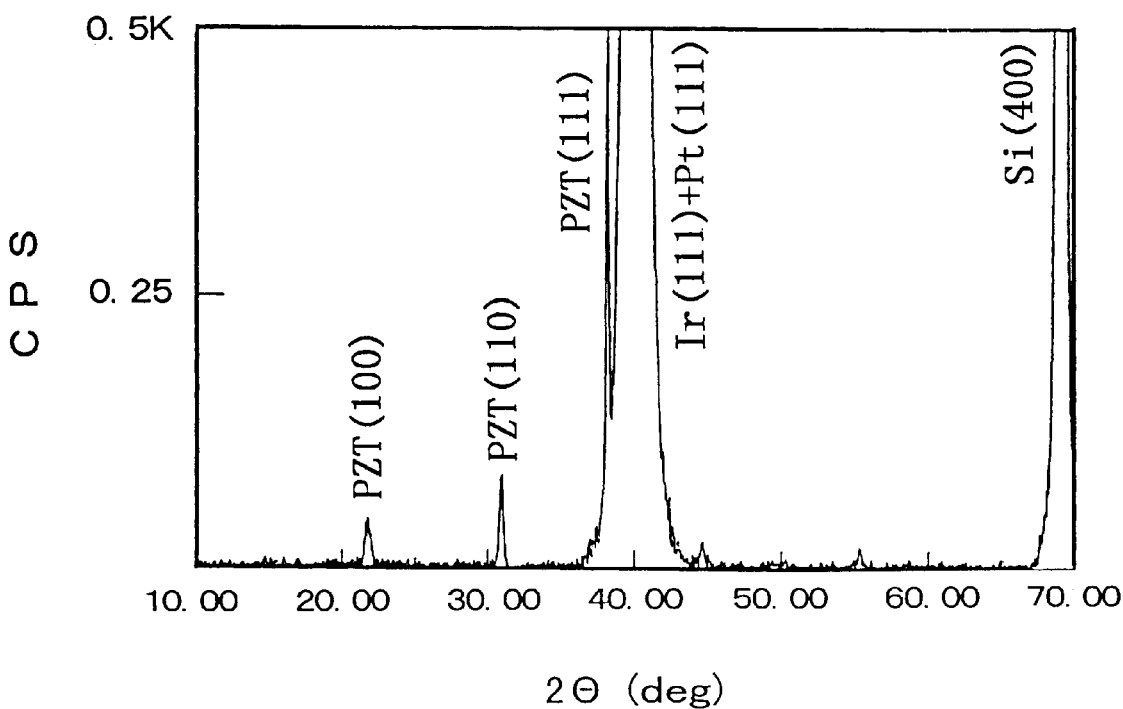
FIG. 18 is a view showing an XRD pattern of an oxide ferroelectric thin film fabricated on an Ir/Pt electrode.

FIG. 18 shows an XRD pattern of a PZT thin film formed on a substrate with a laminate electrode formed thereon and prebaked at 300° C. It will be well understood that, unlike the case of the Ir electrode shown in FIG. 17, a single (111) orientation pattern similar to the case shown in FIG. 5 in which the Pt electrode is prebaked at 300° C. is obtained. Further, the PZT thin film contained only a little of an ordinary dielectric pyrochlore phase. Further, the ferroelectric hysteresis properties obtained in these samples showed an applied-voltage dependency similar to the case of the Pt electrode.

For example, the PZT thin film formed on a substrate with a laminate electrode formed thereon without prebaking or after prebaking at 300° C. showed a residual polarization value of about 20 $\mu C/cm^2$ or 30 $\mu C/cm^2$, respectively, for the maximum applied voltage of 5 V.

Figure 19:
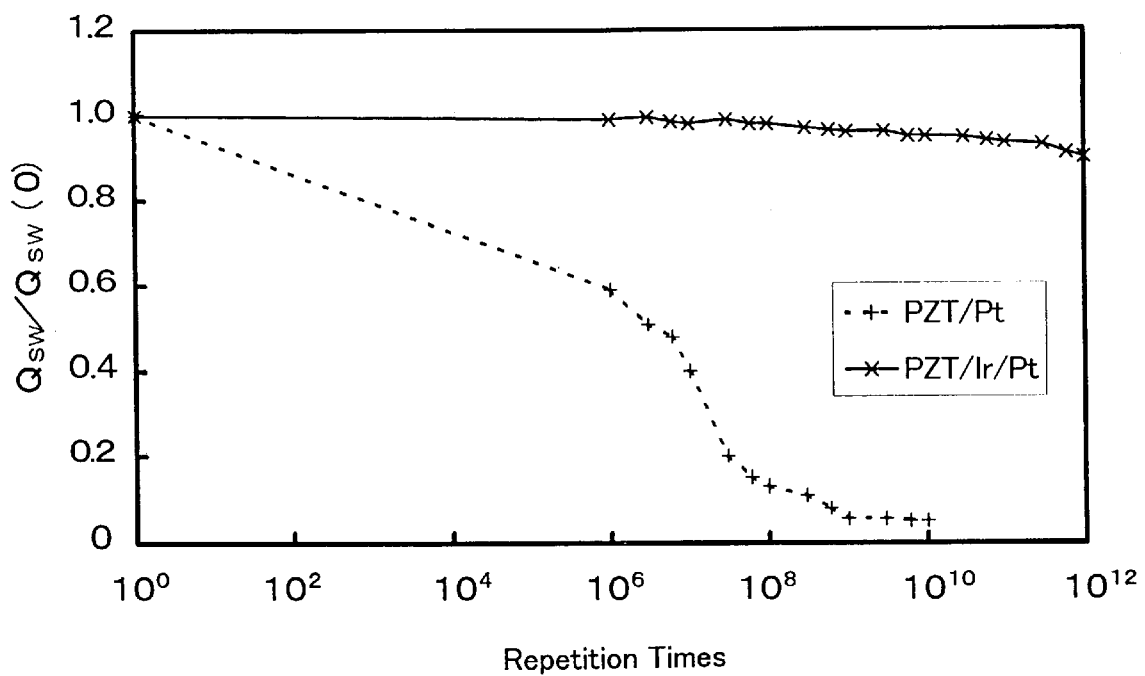
FIG. 19 is a view showing a fatigue property of a capacitor fabricated by using an Ir/Pt electrode.

FIG. 19 shows fatigue endurances of a PZT thin film formed on a substrate with Pt formed thereon and of a PZT thin film formed on a substrate with an Ir/Pt laminate electrode formed thereon. FIG. 19 shows inverse electric charge normalized by an initial value. It will be understood from FIG. 19 that, by repetition of $10^{12}$ times, the inverse electric charge disappears almost completely in the PZT thin film formed on the substrate with Pt formed thereon, whereas the inverse electric charge decreases only by several percent or less in the PZT thin film formed on the substrate with the Ir/Pt laminate electrode formed thereon.

Thus, use of a laminate electrode structure makes it possible to obtain a PZT thin film that does not contain an ordinary dielectric pyrochlore phase and has a good crystallinity with an appropriately controlled orientation, and also the fatigue endurance can be greatly improved.

Hitherto, a Pt electrode structure on an oxide electrode is known. However, in this case, an ordinary dielectric pyrochlore phase is liable to be generated, so that it is difficult to control the composition of a PZT sol-gel solution and, even if the pyrochlore phase did not exist, the film composition of the interface between the substrate with the Pt electrode and the PZT thin film formed thereon would still be different from the composition of the film other than the interface. Therefore, space electric charge is liable to be generated in the ferroelectric memory operation. As a result of this, pinning occurs by a deelectrifying field (anti-electric-field) and the ferroelectric property is liable to be deteriorated. However, such a defect can be removed by using a laminated electrode structure.

As shown and described above, according to the present invention, by prebaking a substrate with an electrode formed thereon, the crystallinity and/or the orientation of the ferroelectric thin film formed on an electrode can be controlled.

Especially, by setting the prebaking temperature in accordance with the change in the thermal expansion coefficient with the temperature of an electrode material, the crystallinity and/or the orientation of the oxide ferroelectric thin film formed thereon can be controlled.

Further, in the case where the oxide ferroelectric thin film is formed by the sol-gel method and crystallized, the oxide ferroelectric thin film can be formed within the temperature range that is adapted to a semiconductor process.

Especially, by performing a thermal treatment for crystallization of the oxide ferroelectric thin film at a temperature and for a period of time that do not affect the crystallinity and/or the orientation of the oxide ferroelectric thin film, it is possible to prevent deterioration of the crystallinity and/or the orientation of the ferroelectric thin film formed thereon due to crystallization, by utilizing the difference in the thermal expansion property of the lower electrode.

Further, in the case where the crystallization temperature is lower than the prebaking temperature, it is possible to assuredly prevent the deterioration of the crystallinity and/or the orientation of the ferroelectric thin film formed thereon by utilizing the difference in the thermal expansion property of the lower electrode.

Also, by prebaking the substrate within the temperature range in which the electrode has a positive thermal expansion coefficient, a ferroelectric thin film having a single (111) orientation can be formed.

Further, by prebaking the substrate within the temperature range in which the electrode has a negative thermal expansion coefficient, a dense and flat ferroelectric thin film can be formed.

Also, by forming the electrode with an electrically conductive material that prevents generation of an ordinary dielectric pyrochlore phase in the oxide ferroelectric thin film to be formed thereon, it is possible to manufacture an oxide ferroelectric thin film being excellent in the fatigue endurance against polarization inversion and having a good crystallinity with an arbitrarily controlled orientation.

Further, in the case where the electrode is formed with an electrically conductive material having different expansion properties that can be distinctly partitioned for a plurality of temperature ranges from room temperature to 700° C., the crystallinity and/or the orientation of the ferroelectric thin film to be formed on the electrode can be controlled by utilizing the difference in the thermal expansion coefficient of the electrode.

Further, according to the present invention, if the electrode contains at least Pt and Ir, the crystallinity and/or the orientation of the ferroelectric thin film to be formed on the electrode can be controlled, and also the oxide ferroelectric thin film can be formed to have an excellent fatigue endurance against polarization inversion.

In addition, if the ferroelectric thin film is made of PZT, a ferroelectric memory having a large residual polarization value from 20 $\mu C/cm^2$ to 30 $\mu C/cm^2$ can be realized and a ferroelectric memory having a capacity of 1 Mbit or more can be realized.

Also, if the coercive field is within the range from 30 kV/cm to 60 kV/cm, a coercive field such as in the case of a bulk can be obtained, so that rewriting in the ferroelectric memory at a low voltage can be facilitated.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

I claim:

1. A method for manufacturing a substrate with an oxide ferroelectric thin film formed thereon comprising the steps of:

forming an electrode on a substrate, prebaking the substrate with the electrode formed thereon; and forming an oxide ferroelectric thin film on the resultant electrode wherein a prebaking temperature is set in accordance with a change in the linear expansion coefficient of an electrically conductive material of the electrode.

2. A method for manufacturing a substrate with an oxide ferroelectric thin film formed thereon according to claim 1, wherein the electrically conductive material constituting the electrode has distinctly different expansion properties in a plurality of temperature ranges within a temperature range from room temperature to about 700° C.

3. A method for manufacturing a substrate with an oxide ferroelectric thin film formed thereon according to claim 1, wherein the prebaking is carried out in a temperature range in which an electrically conductive material constituting the electrode has a positive thermal expansion coefficient.

4. A method for manufacturing a substrate with an oxide ferroelectric thin film formed thereon according to claim 1, wherein the prebaking is carried out in a temperature range in which at least one kind of an electrically conductive material constituting the electrode has a negative thermal expansion coefficient.

5. A method for manufacturing a substrate with an oxide ferroelectric thin film formed thereon according to claim 1, wherein the electrode is formed by laminating an electrically conductive material that does not generate an ordinary dielectric pyrochlore phase in the oxide ferroelectric thin film to be formed thereon, on at least one kind of an electrically conductive material having a linear expansion coefficient that varies with temperature.

6. A method for manufacturing a substrate with an oxide ferroelectric thin film formed thereon according to claim 1, wherein the electrode is constructed to contain at least Pt and Ir.

7. A method for manufacturing a substrate with an oxide ferroelectric thin film formed thereon according to claim 1, wherein the oxide ferroelectric thin film is PZT.

8. A method for manufacturing a substrate with an oxide ferroelectric thin film formed thereon according to claim 1, wherein a prebaking temperature is set within the range from 200° C. or more and less than 700° C.

9. A substrate with an oxide ferroelectric thin film formed thereon by a method according to claim 1.

10. A substrate with an oxide ferroelectric thin film formed thereon according to claim 9, wherein the electrode is constructed to contain at least Pt and Ir.

11. A substrate with an oxide ferroelectric thin film formed thereon according to claim 9 or 10, wherein the oxide ferroelectric thin film is PZT.

12. A method for manufacturing a substance with an oxide ferroelectric thin film formed thereon comprising the steps of:

forming an electrode on a substrate, prebaking the substrate with the electrode formed thereon; and forming an oxide ferroelectric thin film on the resultant electrode, wherein the oxide ferroelectric thin film is crystallized after the oxide ferroelectric thin film is formed by a sol-gel method and the oxide ferroelectric thin film is crystallized by a thermal treatment at a temperature and for a period of time that do not affect a crystallinity and/or orientation of the oxide ferroelectric thin film.

13. A method for manufacturing a substrate with an oxide ferroelectric thin film formed thereon according to claim 12, wherein the oxide ferroelectric thin film is crystallized at a temperature lower then a prebaking temperature.

14. A substrate with an oxide ferroelectric thin film formed thereon by a method comprising the steps of:

forming an electrode on a substrate, prebaking the substrate with the electrode formed thereon; and forming an oxide ferroelectric thin film on the resultant electrode, wherein a crystal orientation of the oxide ferroelectric thin film is substantially a single (111) orientation.

15. A substrate with an oxide ferroelectric thin film formed thereon by a method comprising the steps of:

forming an electrode on a substrate, prebaking the substrate with the electrode formed thereon; and forming an oxide ferroelectric thin film on the resultant electrode, wherein a residual polarization value of the oxide ferroelectric thin film is within a range from 20 $\mu C/cm^2$ to 30 $\mu C/cm^2$.

16. A substrate with an oxide ferroelectric thin film formed thereon by a method comprising the steps of:

forming an electrode on a substrate, prebaking the substrate with the electrode formed thereon; and forming an oxide ferroelectric thin film on the resultant electrode, wherein a coercive field value of the oxide ferroelectric thin film is within a range from 40 kV/cm to 60 kV/cm.

17. A method for manufacturing a substrate with an oxide ferroelectric thin film formed thereon comprising the steps of:

forming an electrode on a substrate;

prebaking the substrate with the electrode formed thereon; and forming an oxide ferroelectric thin film on the resultant electrode wherein a crystallinity and/or orientation of the oxide ferroelectric thin film formed on the electrode is controlled by forming the electrode with at least one kind of an electrically conductive material whose linear expansion coefficient varies with temperature, and by setting a prebaking temperature in accordance with a change in the linear expansion coefficient brought about by a temperature of the electrically conductive material.

* * * * *